(12) United States Patent
Yuan (10) Patent No.: US 12,036,765 B2
(45) Date of Patent: Jul. 16, 2024

(54) CORROSION-RESISTANT COATED ARTICLE AND THERMAL CHEMICAL VAPOR DEPOSITION COATING PROCESS

(71) Applicant: SILCOTEK CORP., Bellefonte, PA (US)

(72) Inventor: Min Yuan, State College, PA (US)

(73) Assignee: Silcotek Corp, Bellefonte, PA (US)

( * ) Notice: Subject to any disclaimer, the term of this patent is extended or adjusted under 35 U.S.C. 154(b) by 311 days.

(21) Appl. No.: 17/487,151

(22) Filed: Sep. 28, 2021

(65) Prior Publication Data

US 2022/0009203 A1 Jan. 13, 2022

Related U.S. Application Data

(63) Continuation of application No. 16/129,989, filed on Sep. 13, 2018, now Pat. No. 11,161,324.

(Continued)

(51) Int. Cl.
*B32B 15/01* (2006.01)
*B32B 15/18* (2006.01)
(Continued)

(52) U.S. Cl.
CPC ............ *B32B 15/013* (2013.01); *B32B 15/01* (2013.01); *B32B 15/012* (2013.01); *B32B 15/18* (2013.01); *C22C 19/05* (2013.01); *C22C 19/055* (2013.01); *C22C 19/056* (2013.01); *C22C 21/00* (2013.01); *C22C 21/02* (2013.01); *C22C 38/001* (2013.01);
(Continued)

(58) Field of Classification Search
None
See application file for complete search history.

(56) References Cited

U.S. PATENT DOCUMENTS 4,173,661 A 11/1979 Bourdon
4,402,997 A 9/1983 Hogan et al.
(Continued)

FOREIGN PATENT DOCUMENTS

CN 100347834 11/2007
CN 104294236 A 1/2015
(Continued)

*Primary Examiner* — Daniel J. Schleis
(74) *Attorney, Agent, or Firm* — Saxton & Stump, LLC (57) ABSTRACT

Corrosion-resistant coated articles and a thermal chemical vapor deposition coating processes are disclosed. The article includes a metallic material having a first composition including a first iron concentration and a first chromium concentration, the first iron concentration being greater than the first chromium concentration, a surface of the metallic material having a second composition including a second iron concentration and a second chromium concentration, the second chromium concentration being less than the first chromium concentration, an oxide layer on the surface of the metallic material having a third composition including an iron oxide concentration and a chromium oxide concentration, the chromium oxide concentration being greater than the iron oxide concentration and being devoid of precipitates, and a thermal chemical vapor deposition coating on the oxide layer. The process includes producing the article by treating to produce the surface, oxidizing to produce the oxide layer, and applying the coating.

20 Claims, 1 Drawing Sheet

Related U.S. Application Data (60) Provisional application No. 62/558,114, filed on Sep. 13, 2017.

(51) Int. Cl.

| | | |
|---|---|---|
| *C22C 19/05* | (2006.01) | |
| *C22C 21/00* | (2006.01) | |
| *C22C 21/02* | (2006.01) | |
| *C22C 38/00* | (2006.01) | |
| *C22C 38/02* | (2006.01) | |
| *C22C 38/04* | (2006.01) | |
| *C22C 38/40* | (2006.01) | |
| *C22C 38/44* | (2006.01) | |
| *C23C 16/40* | (2006.01) | |
| *C23C 16/44* | (2006.01) | |
| *C23C 28/04* | (2006.01) | |

(52) U.S. Cl.
CPC .............. *C22C 38/02* (2013.01); *C22C 38/04* (2013.01); *C22C 38/40* (2013.01); *C22C 38/44* (2013.01); *C23C 16/401* (2013.01); *C23C 16/406* (2013.01); *C23C 16/44* (2013.01); *C23C 28/04* (2013.01)

(56) References Cited

U.S. PATENT DOCUMENTS

| | | |
|---|---|---|
| 4,560,589 A | 12/1985 | Endou et al. |
| 4,579,752 A | 4/1986 | Dubois et al. |
| 4,671,997 A | 6/1987 | Galasso et al. |
| 4,684,542 A | 8/1987 | Jasinski et al. |
| 4,714,632 A | 12/1987 | Cabrera et al. |
| 4,720,395 A | 1/1988 | Foster |
| 4,741,964 A | 5/1988 | Haller |
| 4,749,631 A | 6/1988 | Haluska et al. |
| 4,753,856 A | 6/1988 | Haluska et al. |
| 4,792,460 A | 12/1988 | Chu et al. |
| 4,842,888 A | 6/1989 | Haluska et al. |
| 4,956,204 A | 9/1990 | Amazawa et al. |
| 5,128,515 A | 7/1992 | Tanaka |
| 5,141,567 A | 8/1992 | Tahara |
| 5,160,544 A | 11/1992 | Garg et al. |
| 5,208,069 A | 5/1993 | Clark et al. |
| 5,249,554 A | 10/1993 | Tamor et al. |
| 5,250,451 A | 10/1993 | Chouan |
| 5,270,082 A | 12/1993 | Lin et al. |
| 5,299,731 A | 4/1994 | Liyanage et al. |
| 5,413,813 A | 5/1995 | Cruse et al. |
| 5,474,613 A | 12/1995 | Pickering et al. |
| 5,480,677 A | 1/1996 | Li et al. |
| 5,481,135 A | 1/1996 | Chandra et al. |
| 5,510,146 A | 4/1996 | Miyasaki |
| 5,562,952 A | 10/1996 | Nakahigashi et al. |
| 5,563,102 A | 10/1996 | Michael |
| 5,756,404 A | 5/1998 | Friedenreich et al. |
| 5,818,071 A | 10/1998 | Loboda et al. |
| 5,825,078 A | 10/1998 | Michael |
| 5,874,368 A | 2/1999 | Laxman et al. |
| 5,939,333 A | 8/1999 | Hurley et al. |
| 5,981,403 A | 11/1999 | Ma et al. |
| 5,994,675 A | 11/1999 | Bethune et al. |
| 5,997,742 A | 12/1999 | Gjerde et al. |
| 6,157,003 A | 12/2000 | Drimer |
| 6,159,871 A | 12/2000 | Loboda et al. |
| 6,312,808 B1 | 11/2001 | Veerasamy et al. |
| 6,319,556 B1 | 11/2001 | Olsen et al. |
| 6,337,459 B1 | 1/2002 | Terwijn et al. |
| 6,416,577 B1 | 7/2002 | Suntoloa et al. |
| 6,416,816 B2 | 7/2002 | Veerasamy et al. |
| 6,444,268 B2 | 9/2002 | Lefcowitz et al. |
| 6,444,326 B1 | 9/2002 | Smith |
| 6,472,076 B1 | 10/2002 | Hacker |
| 6,511,760 B1 | 1/2003 | Barone et al. |
| 6,531,182 B2 | 3/2003 | Veerasamy et al. |
| 6,531,398 B1 | 3/2003 | Gaillard et al. |
| 6,531,415 B1 | 3/2003 | Yang et al. |
| 6,566,281 B1 | 5/2003 | Buchanan et al. |
| 6,592,993 B2 | 7/2003 | Veerasamy et al. |
| 6,593,655 B1 | 7/2003 | Loboda et al. |
| 6,630,413 B2 | 10/2003 | Todd |
| 6,765,178 B2 | 7/2004 | Shang et al. |
| 6,998,579 B2 | 2/2006 | Inagawa et al. |
| 7,022,948 B2 | 4/2006 | Shang et al. |
| 7,070,833 B2 | 7/2006 | Smith et al. |
| 7,192,626 B2 | 3/2007 | Dussarrat et al. |
| 7,396,597 B2 | 7/2008 | Nishiyama et al. |
| 7,429,717 B2 | 9/2008 | Yudovsky |
| 7,510,935 B2 | 3/2009 | Lee et al. |
| 7,860,379 B2 | 12/2010 | Hunter et al. |
| 7,867,627 B2 | 1/2011 | Smith et al. |
| 7,875,556 B2 | 1/2011 | Xiao et al. |
| 8,092,770 B2 | 1/2012 | Betz et al. |
| 8,286,571 B2 | 10/2012 | Driver et al. |
| 8,357,430 B2 | 1/2013 | Dussarrat et al. |
| 8,389,059 B2 | 3/2013 | Kusinski et al. |
| D689,107 S | 9/2013 | Grove |
| 8,552,346 B2 | 10/2013 | Ambal et al. |
| 8,563,445 B2 | 10/2013 | Liang et al. |
| D713,024 S | 9/2014 | Grove et al. |
| 8,822,018 B2 | 9/2014 | Thoumazet et al. |
| 8,980,382 B2 | 3/2015 | Ingle et al. |
| 9,340,880 B2 | 5/2016 | Mattzela |
| 9,777,368 B2 | 10/2017 | Smith et al. |
| 9,915,001 B2 | 3/2018 | Yuan et al. |
| 9,975,143 B2 | 5/2018 | Smith et al. |
| 10,087,521 B2 | 10/2018 | Yuan et al. |
| 10,316,408 B2 | 6/2019 | Smith et al. |
| 10,323,321 B1 | 6/2019 | Yuan et al. |
| 10,487,402 B2 | 11/2019 | Yuan et al. |
| 10,487,403 B2 | 11/2019 | Smith |
| 10,604,660 B2 | 3/2020 | Smith et al. |
| 2001/0049203 A1 | 12/2001 | Kim et al. |
| 2001/0055672 A1 | 12/2001 | Todd |
| 2002/0045009 A1 | 4/2002 | Tobaski et al. |
| 2003/0152701 A1 | 8/2003 | Kang et al. |
| 2003/0186000 A1 | 10/2003 | Li et al. |
| 2004/0037956 A1 | 2/2004 | Yang |
| 2004/0175579 A1 | 9/2004 | Smith et al. |
| 2005/0064684 A1 | 3/2005 | Todd et al. |
| 2005/0100670 A1 | 5/2005 | Dussarrat et al. |
| 2005/0183663 A1 | 8/2005 | Cheng et al. |
| 2005/0271893 A1 | 12/2005 | Kobrin et al. |
| 2006/0216952 A1 | 9/2006 | Bhanap et al. |
| 2007/0042118 A1 | 2/2007 | Yoo |
| 2007/0067984 A1 | 3/2007 | Gaillard et al. |
| 2007/0243317 A1 | 10/2007 | DuBois et al. |
| 2007/0281448 A1 | 12/2007 | Chen et al. |
| 2009/0078202 A1 | 3/2009 | Strikovski et al. |
| 2009/0230558 A1 | 9/2009 | Matsuoka |
| 2010/0248496 A1 | 9/2010 | Wei et al. |
| 2011/0259879 A1 | 10/2011 | Hanawa et al. |
| 2011/0305784 A1 | 12/2011 | Lee |
| 2012/0045954 A1 | 2/2012 | Bleecher et al. |
| 2012/0219727 A1 | 8/2012 | Gandhiraman et al. |
| 2012/0251797 A1 | 10/2012 | Smith et al. |
| 2013/0244025 A1* | 9/2013 | Smith ............... C09D 5/00 428/447 |
| 2014/0256156 A1 | 9/2014 | Harada et al. |
| 2014/0370300 A1 | 12/2014 | Smith |
| 2015/0024152 A1 | 1/2015 | Carr et al. |
| 2015/0030885 A1 | 1/2015 | Smith |
| 2015/0206795 A1 | 7/2015 | Hasebe et al. |
| 2015/0283307 A1 | 10/2015 | Smith et al. |
| 2015/0371991 A1 | 12/2015 | Nobuto |
| 2016/0049309 A1 | 2/2016 | Tapily et al. |
| 2016/0354758 A1 | 12/2016 | Gorecki et al. |
| 2018/0318742 A1 | 11/2018 | Bevis |

(56) References Cited

U.S. PATENT DOCUMENTS

2019/0003044 A1    1/2019  Yuan
2019/0086371 A1    3/2019  Lauber et al.

FOREIGN PATENT DOCUMENTS

| | | |
|---|---|---|
| DE | 2523257 | 12/1976 |
| DE | 2829568 | 1/1980 |
| EP | 0911307 A1 | 4/1999 |
| EP | 1150345 A2 | 4/2001 |
| EP | 0996767 B1 | 9/2003 |
| EP | 1790757 A1 | 5/2007 |
| EP | 1988190 A2 | 11/2008 |
| GB | 2395492 A | 5/2004 |
| JP | 2012138627 A | 7/2012 |
| JP | 2013227628 A | 11/2013 |
| NO | 2010125926 A1 | 4/2010 |
| WO | 9902757 A1 | 1/1999 |
| WO | 0136190 A1 | 5/2001 |
| WO | 2009032488 A1 | 3/2009 |
| WO | 2009143618 A1 | 12/2009 |
| WO | 2010079299 A1 | 7/2010 |
| WO | 2011056550 A1 | 5/2011 |
| WO | 2012047945 A2 | 4/2012 |

\* cited by examiner

CORROSION-RESISTANT COATED ARTICLE AND THERMAL CHEMICAL VAPOR DEPOSITION COATING PROCESS

PRIORITY

The present application is a non-provisional patent application claiming priority and benefit of U.S. patent application Ser. No. 16/129,989, filed Sep. 13, 2018, titled CORROSION-RESISTANT COATED ARTICLE AND THERMAL CHEMICAL VAPOR DEPOSITION COATING PROCESS which claims priority and benefit of U.S. Provisional Patent Application No. 62/558,114, filed Sep. 13, 2017, titled CORROSION-RESISTANT COATED ARTICLE AND THERMAL CHEMICAL VAPOR DEPOSITION COATING PROCESS, the entirety of which is incorporated by reference.

FIELD OF THE INVENTION

The present invention is directed to corrosion-resistant coated articles, processes of producing such articles, and processes of using such articles. More particularly, the present invention is directed to thermal chemical vapor deposition coated corrosion-resistant articles, processes of producing such articles, and processes of using such articles.

BACKGROUND OF THE INVENTION

Citric acid and nitric acid passivation are well known processes for providing corrosion resistance. Federal Specification QQ-P-35C (cancelled in 1997), titled "PASSIVATION TREATMENTS FOR CORROSION-RESISTANT STEEL," the entirety of which is incorporated by reference, describes nitric acid passivation techniques employed since at least 1988. Other variations have been employed since the 1960's. A variety of concentrations are disclosed in QQ-P-35C for a variety of applications.

US Patent Application Publication 2013/0105083, titled "SYSTEMS COMPRISING SILICON COATED GAS SUPPLY CONDUITS AND METHODS FOR APPLYING COATINGS," which is hereby incorporated by reference, describes a process of using nitric acid for passivation. Specifically, the metal is electropolished (chemical smoothed), and then nitric acid passivated to result in chrome oxide being at a ratio of greater than 2 to 1 in comparison to iron oxide. The nitric-acid-passivated surface is then coated with amorphous silicon by thermal chemical vapor deposition.

ASTM standard 967 describes passivation techniques for nitric acid, thereby superseding Federal Specification QQ-P-35C, but also describes passivation techniques for citric acid. In 2009, the United States National Aeronautic and Space Administration (NASA) identified a desire to replace nitric acid with citric acid for passivation purposes due to environmental and health issues associated with use and disposal of nitric acid.

In a document from 2013, titled "ALTERNATIVE TO NITRIC ACID PASSIVATION, DoD Corrosion Conference 2013," the entirety of which is incorporated by reference, citric acid and nitric acid were compared. The conclusion was that "it appears that citric acid performs as well as, or better than nitric acid." The data supporting such conclusions shows equal corrosion resistance or slightly better corrosion resistance resulting from passivation with nitric or citric acid, dependent upon the selected substrate alloy.

The known techniques suffer from drawbacks of not having sufficient corrosion resistance, having limitations on processing capabilities, having limitations on compatibilities, and having a variety of other limitations.

A corrosion-resistant coated article that shows further improvements would be desirable in the art.

BRIEF DESCRIPTION OF THE INVENTION

In an embodiment, a corrosion-resistant coated article includes a metallic material having a first composition including a first iron concentration and a first chromium concentration, the first iron concentration being greater than the first chromium concentration, a surface of the metallic material having a second composition including a second iron concentration and a second chromium concentration, the second chromium concentration being less than the first chromium concentration, an oxide layer on the surface of the metallic material having a third composition including an iron oxide concentration and a chromium oxide concentration, the chromium oxide concentration being greater than the iron oxide concentration and being devoid of precipitates, and a thermal chemical vapor deposition coating on the oxide layer.

In another embodiment, a coating process includes providing a metallic substrate, the metallic material having a first composition including a first iron concentration and a first chromium concentration, the first iron concentration being greater than the first chromium concentration, applying a treatment to the metallic substrate, thereby forming a metallic surface of the metallic substrate, the metallic surface having a second composition including a second iron concentration and a second chromium concentration, the second chromium concentration being less than the first chromium concentration, rinsing the treatment from the metallic substrate, thereby forming rinsed metallic surface, oxidizing the rinsed metallic surface, thereby forming an oxide layer, the oxide layer having a third composition including an iron oxide concentration and a chromium oxide concentration, the chromium oxide concentration being at least three times, by weight, greater than the iron oxide concentration, and applying a thermal chemical vapor deposition coating to the oxide layer.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are corrosion-resistant coated articles, processes of producing such articles, and processes of using such articles. Embodiments of the present disclosure, for example, in comparison to concepts failing to include one or more of the features disclosed herein, increase consistency/repeatability of treatment, allow use of thermal processing cycles after cleaning and/or treatment, remove additional residual materials and/or contaminants (for example, residual treatment and/or cleaning materials), reduce or eliminate effects of residual materials thermally processed, increase inertness, increase resistance to sulfur adsorption, homogenize aesthetics, modify microstructure, modify optical properties, modify porosity, modify corrosion resistance, modify gloss, modify surface features, permit more efficient production of treatments, permit treatment of a wide range of geometries (for example, narrow channels/tubes, three-dimensionally complex geometries, and/or hidden or non-line-of-site geometries, such as, in needles, tubes, probes, fixtures, complex planar and/or non-planar geometry articles, simple non-planar and/or planar geometry articles, and combinations thereof), reduce or eliminate defects/microporosity, permit treatment of a bulk of articles, are capable or being used in or replacing components that are used in industries traditionally believed to be too sensitive for processes that are not flow-through processes (for example, based upon compositional purity, presence of contaminants, thickness uniformity, and/or amount of gas phase nucleation embedded within), allow materials to be used as a substrate that would otherwise produce an electrical arc in a plasma environment, or permit a combination thereof.

Figure 1:
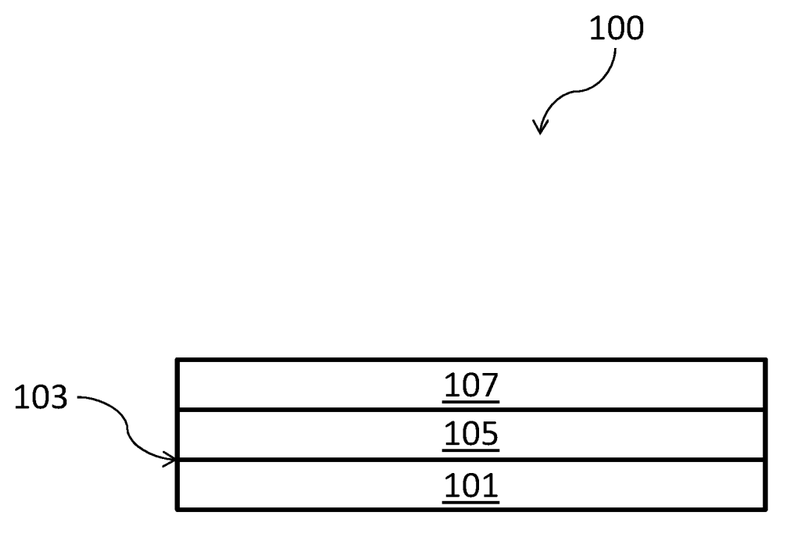
FIG. 1 is a schematic view of a thermal chemical vapor deposition process, according to an embodiment of the disclosure.

Referring to FIG. 1, in one embodiment, a corrosion-resistant coated article 100 includes a metallic material 101, a surface 103, an oxide layer 105 (for example, being devoid of precipitates, such as, those that occur with nitric acid passivation), and a thermal chemical vapor deposition coating 107. Suitable components capable of being produced into the corrosion-resistant article 100 include, but are not limited to, fittings (for example, unions, connectors, adaptors, other connections between two or more pieces of tubing, for example, capable of making a leak-free or substantially leak-free seal), compression fittings (including ferrules, such as, a front and back ferrule), tubing (for example, coiled tubing, tubing sections such as used to connect a sampling apparatus, pre-bent tubing, straight tubing, loose wound tubing, tightly bound tubing, and/or flexible tubing, whether consisting of the interior being treated or including the interior and the exterior being treated), valves (such as, gas sampling, liquid sampling, transfer, shut-off, or check valves, for example, including a rupture disc, stem, poppet, rotor, multi-position configuration, able to handle vacuum or pressure, a handle or stem for a knob, ball-stem features, ball valve features, check valve features, springs, multiple bodies, seals, needle valve features, packing washers, and/or stems), quick-connects, sample cylinders, regulators and/or flow-controllers (for example, including o-rings, seals, and/or diaphragms), injection ports (for example, for gas chromatographs), in-line filters (for example, having springs, sintered metal filters, mesh screens, and/or weldments), glass liners, gas chromatograph components, liquid chromatography components, components associated with vacuum systems and chambers, components associated with analytical systems, sample probes, control probes, downhole sampling containers, drilled and/or machined block components, manifolds, particles, powders, or a combination thereof.

In one embodiment, the corrosion-resistant coated article 100 has a non-planar geometry. Exemplary non-planar geometries include having features selected from the group consisting of channels, curves, threading, vanes, protrusions, cavities, junctions, mating interfaces, and combinations thereof.

The corrosion-resistant coated article 100 has increased corrosion resistance, for example, in comparison to comparative passivated articles. As used herein, the term "comparative" refers to something having other features that are identical, with the only difference being the aspect identified. For example, a comparative passivated article (not shown) and the corrosion-resistant coated article 100 have the same geometry and the same metallic material, but the comparative passivated article does not have the thermal chemical vapor deposition coating 107 or the oxide layer 105, and depending upon the comparative passivated article, may not have the same chemistry in a comparative surface (not shown) of the comparative passivated article as the surface 103 of the corrosion-resistant coated article 100.

In one embodiment, the corrosion-resistant coated article 100 has increased corrosion resistance in comparison to a first comparative nitric-acid passivated article treated with a solution of 20 to 25 volume percent of nitric acid and 2.5 to 0.5 weight percent of sodium dichromate dehydrate, with immersion for a minimum of 20 min at a temperature in the range from 50 to 55° C.

In one embodiment, the corrosion-resistant coated article 100 has increased corrosion resistance in comparison to a second comparative nitric-acid passivated article treated with a solution of 20 to 45 volume percent of nitric acid, immersed for a minimum of 30 min at a temperature in the range from 20 to 30° C.

In one embodiment, the corrosion-resistant coated article 100 has increased corrosion resistance in comparison to a third comparative nitric-acid passivated article treated with a solution of 20 to 25 volume percent of nitric acid, immersed for a minimum of 20 min at a temperature in the range from 50 to 60° C.

In one embodiment, the corrosion-resistant coated article 100 has increased corrosion resistance in comparison to a fourth comparative nitric-acid passivated article treated with a solution of 45 to 55 volume percent of nitric acid, immersed for a minimum of 30 min at a temperature in the range from 50 to 55° C.

In one embodiment, the corrosion-resistant coated article 100 has increased corrosion resistance in comparison to a first comparative citric-acid passivated article treated with a solution of 4 to 10 weight percent of citric acid, immersed for a minimum of 4 min at a temperature in the range from 60 to 70° C.

In one embodiment, the corrosion-resistant coated article 100 has increased corrosion resistance in comparison to a second comparative citric-acid passivated article treated with a solution of 4 to 10 weight percent of citric acid, immersed for a minimum of 10 min at a temperature in the range from 50 to 60° C.

In one embodiment, the corrosion-resistant coated article 100 has increased corrosion resistance in comparison to a third comparative citric-acid passivated article treated with a solution of 4 to 10 weight percent of citric acid, immersed for a minimum of 20 min at a temperature in the range from 20 to 50° C.

In one embodiment, the corrosion-resistant coated article 100 has increased corrosion resistance in comparison to a comparative coated article having the thermal chemical vapor deposition coating 107, for example, with the comparative coated article having different surface composition (for example, by not being passivated and/or being passivated under conditions not producing the corrosion-resistance) and/or not having the oxide layer 105.

The metallic material 101 is any suitable material capable of being passivated. In various embodiments, the metallic material 101 is tempered or non-tempered, has grain structures that are equiaxed, directionally-solidified, and/or single crystal, has amorphous or crystalline structures, is a foil, fiber, a cladding, and/or a film.

In one embodiment, the metallic material 101 has a first iron concentration and a first chromium concentration, the first iron concentration being greater than the first chromium concentration. For example, suitable values for the first iron concentration include, but are not limited to, by weight, greater than 50%, greater than 60%, greater than 66%, greater than 70%, between 66% and 74%, between 70% and 74%, or any suitable combination, sub-combination, range, or sub-range therein. Suitable values for the first chromium concentration include, but are not limited to, by weight, greater than 10.5%, greater than 14%, greater than 16%, greater than 18%, greater than 20%, between 14% and 17%, between 16% and 18%, between 18% and 20%, between 20% and 24%, or any suitable combination, sub-combination, range, or sub-range therein.

Suitable metallic materials 101 include, but are not limited to, ferrous-based alloys, non-ferrous-based alloys, nickel-based alloys, stainless steels (martensitic or austenitic), aluminum alloys, composite metals, or combinations thereof.

In an alternative embodiment, the metallic material 101 is replaced with a non-metallic material. Suitable non-metal or non-metallic materials include, but are not limited to, ceramics, glass, ceramic matrix composites, or a combination thereof.

In one embodiment, the metallic material 101 is or includes a composition, by weight, of up to 0.08% carbon, between 18% and 20% chromium, up to 2% manganese, between 8% and 10.5% nickel, up to 0.045% phosphorus, up to 0.03% sulfur, up to 1% silicon, and a balance of iron (for example, between 66% and 74% iron).

In one embodiment, the metallic material 101 is or includes a composition, by weight, of up to 0.08% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material 101 is or includes a composition, by weight, of up to 0.03% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material 101 is or includes a composition, by weight, of between 14% and 17% chromium, between 6% and 10% iron, between 0.5% and 1.5% manganese, between 0.1% and 1% copper, between 0.1% and 1% silicon, between 0.01% and 0.2% carbon, between 0.001% and 0.2% sulfur, and a balance nickel (for example, 72%).

In one embodiment, the metallic material 101 is or includes a composition, by weight, of between 20% and 24% chromium, between 1% and 5% iron, between 8% and 10% molybdenum, between 10% and 15% cobalt, between 0.1% and 1% manganese, between 0.1% and 1% copper, between 0.8% and 1.5% aluminum, between 0.1% and 1% titanium, between 0.1% and 1% silicon, between 0.01% and 0.2% carbon, between 0.001% and 0.2% sulfur, between 0.001% and 0.2% phosphorus, between 0.001% and 0.2% boron, and a balance nickel (for example, between 44.2% and 56%).

In one embodiment, the metallic material 101 is or includes a composition, by weight, of between 20% and 23% chromium, between 4% and 6% iron, between 8% and 10% molybdenum, between 3% and 4.5% niobium, between 0.5% and 1.5% cobalt, between 0.1% and 1% manganese, between 0.1% and 1% aluminum, between 0.1% and 1% titanium, between 0.1% and 1% silicon, between 0.01% and 0.5% carbon, between 0.001% and 0.02% sulfur, between 0.001% and 0.02% phosphorus, and a balance nickel (for example, 58%).

In one embodiment, the metallic material 101 is or includes a composition, by weight, of between 25% and 35% chromium, between 8% and 10% iron, between 0.2% and 0.5% manganese, between 0.005% and 0.02% copper, between 0.01% and 0.03% aluminum, between 0.3% and 0.4% silicon, between 0.005% and 0.03% carbon, between 0.001% and 0.005% sulfur, and a balance nickel (for example, 59.5%).

In one embodiment, the metallic material 101 is or includes a composition, by weight, of between 17% and 21% chromium, between 2.8% and 3.3% iron, between 4.75% and 5.5% niobium, between 0.5% and 1.5% cobalt, between 0.1% and 0.5% manganese, between 0.2% and 0.8% copper, between 0.65% and 1.15% aluminum, between 0.2% and 0.4% titanium, between 0.3% and 0.4% silicon, between 0.01% and 1% carbon, between 0.001 and 0.02% sulfur, between 0.001 and 0.02% phosphorus, between 0.001 and 0.02% boron, and a balance nickel (for example, between 50% and 55%).

In one embodiment, the metallic material 101 is or includes a composition, by weight, of between 2% and 3% cobalt, between 15% and 17% chromium, between 5% and 17% molybdenum, between 3% and 5% tungsten, between 4% and 6% iron, between 0.5% and 1% silicon, between 0.5% and 1.5% manganese, between 0.005 and 0.02% carbon, between 0.3% and 0.4% vanadium, and a balance nickel.

In one embodiment, the metallic material 101 is or includes a composition, by weight, of up to 0.15% carbon, between 3.5% and 5.5% tungsten, between 4.5% and 7% iron, between 15.5% and 17.5% chromium, between 16% and 18% molybdenum, between 0.2% and 0.4% vanadium, up to 1% manganese, up to 1% sulfur, up to 1% silicon, up to 0.04% phosphorus, up to 0.03% sulfur, and a balance nickel.

In one embodiment, the metallic material 101 is or includes a composition, by weight, of up to 2.5% cobalt, up to 22% chromium, up to 13% molybdenum, up to 3% tungsten, up to 3% iron, up to 0.08% silicon, up to 0.5% manganese, up to 0.01% carbon, up to 0.35% vanadium, and a balance nickel (for example, 56%).

In one embodiment, the metallic material 101 is or includes a composition, by weight, of between 1% and 2% cobalt, between 20% and 22% chromium, between 8% and 10% molybdenum, between 0.1% and 1% tungsten, between 17% and 20% iron, between 0.1% and 1% silicon, between 0.1% and 1% manganese, between 0.05 and 0.2% carbon, and a balance nickel.

In one embodiment, the metallic material 101 is or includes a composition, by weight, of between 0.01% and 0.05% boron, between 0.01% and 0.1% chromium, between 0.003% and 0.35% copper, between 0.005% and 0.03% gallium, between 0.006% and 0.8% iron, between 0.006% and 0.3% magnesium, between 0.02% and 1% silicon+iron, between 0.006% and 0.35% silicon, between 0.002% and 0.2% titanium, between 0.01% and 0.03% vanadium+titanium, between 0.005% and 0.05% vanadium, between 0.006% and 0.1% zinc, and a balance aluminum (for example, greater than 99%).

In one embodiment, the metallic material 101 is or includes a composition, by weight, of between 0.05% and 0.4% chromium, between 0.03% and 0.9% copper, between 0.05% and 1% iron, between 0.05% and 1.5% magnesium, between 0.5% and 1.8% manganese, between 0.5% and 0.1% nickel, between 0.03% and 0.35% titanium, up to 0.5% vanadium, between 0.04% and 1.3% zinc, and a balance aluminum (for example, between 94.3% and 99.8%).

In one embodiment, the metallic material 101 is or includes a composition, by weight, of between 0.0003% and 0.07% beryllium, between 0.02% and 2% bismuth, between 0.01% and 0.25% chromium, between 0.03% and 5% copper, between 0.09% and 5.4% iron, between 0.01% and 2% magnesium, between 0.03% and 1.5% manganese, between 0.15% and 2.2% nickel, between 0.6% and 21.5% silicon, between 0.005% and 0.2% titanium, between 0.05% and 10.7% zinc, and a balance aluminum (for example, between 70.7% to 98.7%).

In one embodiment, the metallic material 101 is or includes a composition, by weight, of between 0.15% and 1.5% bismuth, between 0.003% and 0.06% boron, between 0.03% and 0.4% chromium, between 0.01% and 1.2% copper, between 0.12% and 0.5% chromium+manganese, between 0.04% and 1% iron, between 0.003% and 2% lead, between 0.2% and 3% magnesium, between 0.02% and 1.4% manganese, between 0.05% and 0.2% nickel, between 0.5% and 0.5% oxygen, between 0.2% and 1.8% silicon, up to 0.05% strontium, between 0.05% and 2% tin, between 0.01% and 0.25% titanium, between 0.05% and 0.3% vanadium, between 0.03% and 2.4% zinc, between 0.05% and 0.2% zirconium, between 0.150 and 0.2% zirconium+titanium, and a balance of aluminum (for example, between 91.7% and 99.6%).

In one embodiment, the metallic material 101 is or includes a composition, by weight, of between 0.4% and 0.8% silicon, up to 0.7% iron, between 0.15% and 0.4% copper, up to 0.15% manganese, between 0.8% and 1.2% magnesium, between 0.04% and 0.35% chromium, up to 0.25% zinc, up to 0.15% titanium, optional incidental impurities (for example, at less than 0.05% each, totaling less that 0.15%), and a balance of aluminum (for example, between 95% and 98.6%).

In one embodiment, the substrate 103 is or includes a composition, by weight, of between 11% and 13% silicon, up to 0.6% impurities/residuals, and a balance of aluminum.

The surface 103 is an exterior portion of the metallic material 101 and is produced by applying a treatment to the metallic substrate 101. In one embodiment, the treatment is or includes a passivation, for example, with nitric acid, citric acid, and/or any other suitable passivation agents, such as is described above.

Suitable compositions of the treatment include having, nitric acid, citric acid, sodium dichromate, oxalic acid, s solubilizer, a chelating agent, a surfactant, an anti-foaming agent, or a combination thereof. In one embodiment, the composition of the treatment includes nitric acid or citric acid at between 4% and 10%, 5% and 8%, 7% and 8%, by weight, and/or, between 0.2% and 1%, 2% and 5%, 5% and 10%, 5% and 25%, 10% and 20%, 15% and 20%, 10% and 15%, by volume, or any suitable combination, sub-combination, range, or sub-range therein.

Suitable durations of the treatment (independent of any subsequent rinse) include, but are not limited to, a minimum of 4 minutes, a minimum of 10 minutes, a minimum of 20 minutes, a minimum of 30 minutes, between 4 minutes and 30 minutes, between 4 minutes and 20 minutes, between 4 minutes and 10 minutes, between 10 minutes and 30 minutes, between 10 minutes and 20 minutes, between 4 minutes and 90 minutes, between 10 minutes and 90 minutes, between 20 minutes and 90 minutes, between 40 minutes and 90 minutes, between 70 minutes and 90 minutes, at least 100 minutes, or any suitable combination, sub-combination, range, or sub-range therein.

Suitable temperatures for the treatment include, but are not limited to, between 20 and 80° C., between 20 and 70° C., between 20 and 60° C., between 20 and 50° C., between 20 and 30° C., between 50 and 55° C., between 50 and 60° C., between 60 and 70° C., between 60 and 80° C., between 70 and 80° C., or any suitable combination, sub-combination, range, or sub-range therein.

In a further embodiment, the treatment includes a rinse, for example, immediately after removal from a passivating solution and/or the additional components of the treatment. The surface 103 is rinsed using stagnant, countercurrent, or spray washes, singly or in combination, with or without a separate chemical treatment for neutralization, followed by a final rinse using water (such as deionized water) to achieve a total solids content of less than 200 ppm. In one embodiment, the neutralization includes an immersion for at least 30 minutes in a solution of at least 5% NaOH (by weight) within a temperature range of between 70 and 80 degrees Celsius.

The surface 103 and the metallic material 101 have differing features and/or properties. In one embodiment, the surface 103 and the metallic material 101 differ on electrical or optical properties. In one embodiment, the surface 103 of the metallic material 101 has a second composition including a second iron concentration and a second chromium concentration, the second chromium concentration being less than the first chromium concentration and/or differing from the first composition of the metallic material 101.

The oxide layer 105 is on the surface 103, extends into the surface 103, or extends through the surface 103 into or bordering the metallic material 101. The oxide layer 105 is formed by oxidizing the surface 103 and/or the metallic material 101. In one embodiment, the oxidizing is performed within an enclosed vessel. The enclosed vessel has any dimensions or geometry that allows suitable temperature and the pressures. In one embodiment, the dimensions for the enclosed vessel include, but are not limited to, having a minimum width of greater than 5 cm, greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes for the enclosed vessel include, but are not limited to, at least 1,000 $cm^3$, greater than 3,000 $cm^3$, greater than 5,000 $cm^3$, greater than 10,000 $cm^3$, greater than 20,000 $cm^3$, between 3,000 $cm^3$ and 5,000 $cm^3$, between 5,000 $cm^3$ and 10,000 $cm^3$, between 5,000 $cm^3$ and 20,000 $cm^3$, between 10,000 $cm^3$ and 20,000 $cm^3$, any other volumes capable of uniform or substantially uniform heating, or any suitable combination, sub-combination, range, or sub-range therein.

In one embodiment, an oxidant is introduced to the enclosed vessel. Suitable oxidants include, but are not limited to, water (alone, with zero air, or with an inert gas), oxygen (for example, at a concentration, by weight, of at least 50%), air (for example, alone, not alone, and/or as zero air), nitrous oxide, ozone, peroxide, or a combination thereof. As used herein, the term "zero air" refers to atmospheric air having less than 0.1 ppm total hydrocarbons. The term "air" generally refers to a gaseous fluid, by weight, of mostly nitrogen, with the oxygen being the second highest concentration species within. For example, in one embodiment, the nitrogen is present at a concentration, by weight, of at least 70% (for example, between 75% and 76%) and oxygen is present at a concentration, by weight, of at least 20% (for example, between 23% and 24%).

In one embodiment, the oxide layer 105 has a third composition including an iron oxide concentration and a chromium oxide concentration, the chromium oxide concentration being at least three times, by weight, greater than the iron oxide concentration and/or being different from the second composition and/or the first composition. As used herein, the term "thickness," as it relates to the oxide layer 105, is the region having non-native oxygen, for example, proximal to the metallic material 101 being at an atomic concentration being greater than 5% of oxygen concentration of the metallic material 101 and proximal to the chemical vapor deposition 107 having a higher atomic concentration of oxygen compared to silicon. Suitable thicknesses of the oxide layer include, but are not limited to, greater than 3 nanometers, greater than 5 nanometers, between 3 nanometers and 5 nanometers, between 3 nanometers and 10 nanometers, greater than 20 nanometers, between 3 nanometers and 20 nanometers, between 5 nanometers and 10 nanometers, between 5 nanometers and 20 nanometers, or any suitable combination, sub-combination, range, or sub-range therein. Alternatively, in one embodiment, the oxide layer has a thickness of less than 1.5 nanometers.

In one embodiment, the oxide layer 105 is devoid or substantially devoid of one or more elements. For example, in one embodiment, the oxide layer 105 is devoid of phosphorus and/or substantially devoid of phosphorus, for example, by the oxide layer 105 having a concentration, by weight, of phosphorus that is below 0.001%. In one embodiment, the oxide layer 105 is devoid of sodium and/or substantially devoid of sodium, for example, by the oxide layer 105 having a concentration, by weight, of sodium that is below 0.001%.

The thermal chemical vapor deposition coating 107 is on the oxide layer 105 and/or diffuses into the oxide layer 105. The thermal chemical vapor deposition coating 107 is produced on all exposed surfaces. As used herein, the term "exposed," with regard to "exposed surfaces," refers to any surface that is in contact with gas during the process, and is not limited to line-of-site surfaces or surfaces proximal to line-of-site directions as are seen in flow-through chemical vapor deposition processes that do not have an enclosed vessel. As will be appreciated by those skilled in the art, the corrosion-resistant coated article 100 is capable of being incorporated into a larger component or system (not shown).

The thermal chemical vapor deposition coating 107 is produced, for example, thereby providing features and properties unique to being produced through the thermal chemical vapor deposition process, according to the disclosure, which is a static process using the enclosed vessel contrasted to flowable chemical vapor deposition that has concurrent flow of a precursor into and out of a chamber. As used herein, the phrase "thermal chemical vapor deposition" refers to a reaction and/or decomposition of one or more gases, for example, in a starved reactor configuration, and is distinguishable from plasma-assisted chemical vapor deposition, radical-initiated chemical vapor deposition, and/or catalyst-assisted chemical vapor deposition, sputtering, atomic layer deposition (which is limited to a monolayer molecular deposition per cycle in contrast being capable of more than one layer of molecular deposition), and/or epitaxial growth (for example, growth at greater than 700° C.).

In one embodiment, the chemical vapor deposition coating 107 is on the corrosion-resistant coated article 100 on regions that are unable to be coated through line-of-sight techniques.

In one embodiment, one or a plurality of articles having the oxide layer 105 are positioned within the enclosed vessel. In further embodiments, the positioning is manually with the articles being arranged in a vertical (stacked) orientation separated by supports (and thus obstructed from line-of-sight), arranged laterally or perpendicular to gravity (for example, with all or most openings being perpendicular to gravity), arranged in an overlapping manner that reduces the amount of volume available for gas phase nucleation, positioned in a fixture corresponding with the geometry of the articles, or a combination thereof.

After the positioning, the process includes introducing a precursor fluid (for example, liquid or gas, but not plasma) to the enclosed vessel, for example, as a first aliquot, then soaking the oxide layer 105 at a temperature above the thermal decomposition temperature of the precursor fluid to produce the thermal chemical vapor deposition coating 107. In one embodiment, the process further includes repeating the introducing of the precursor fluid, for example, as a second aliquot, or introducing a different precursor fluid, to produce additional layers. The soaking is at a temperature above the thermal decomposition temperature of the precursor fluid or the different precursor fluid.

Suitable thicknesses of the thermal chemical vapor deposition coating 107 include, but are not limited to, between 100 nanometers and 10,000 nanometers, between 100 nanometers and 1,000 nanometers, between 100 nanometers and 800 nanometers, between 200 nanometers and 600 nanometers, between 200 nanometers and 10,000 nanometers, between 500 nanometers and 3,000 nanometers, between 500 nanometers and 2,000 nanometers, between 500 nanometers and 1,000 nanometers, between 1,000 nanometers and 2,000 nanometers, between 1,000 nanometers and 1,500 nanometers, between 1,500 nanometers and 2,000 nanometers, 800 nanometers, 1,200 nanometers, 1,600 nanometers, 1,900 nanometers, or any suitable combination, sub-combination, range, or sub-range therein.

The thermal chemical vapor deposition coating 107 is formed by one or more of the following fluids: silane, silane and ethylene, silane and an oxidizer, dimethylsilane, dimethylsilane and an oxidizer, trimethylsilane, trimethylsilane and an oxidizer, dialkylsilyl dihydride, alkylsilyl trihydride, non-pyrophoric species (for example, dialkylsilyl dihydride and/or alkylsilyl trihydride), thermally-reacted material (for example, carbosilane and/or carboxysilane, such as, amorphous carbosilane and/or amorphous carboxysilane), species capable of a recombination of carbosilyl (disilyl or trisilyl fragments), methyltrimethoxysilane, methyltriethoxysilane, dimethyldimethoxysilane, dimethyldiethoxysilane trimethylmethoxysilane, trimethylethoxysilane, ammonia, hydrazine, trisilylamine, Bis(tertiary-butylamino)silane, 1,2-bis (dimethylamino)tetramethyldisilane, dichlorosilane, hexachlorodisilane), organofluorotrialkoxysilane, organofluorosilylhydride, organofluorosilyl, fluorinated alkoxysilane, fluoroalkylsilane, fluorosilane, tridecafluoro 1,1,2,2-tetrahydrooctylsilane, (tridecafluoro-1,1,2,2-tetrahydrooctyl) triethoxysilane, triethoxy (3,3,4,4,5,5,6,6,7,7,8,8,8-tridecafluoro-1-octyl) silane, (perfluorohexylethyl) triethoxysilane, silane (3,3,4,4,5,5,6,6,7,7,8,8,9,9,10,10,10-heptadecafluorodecyl) trimethoxy-, or a combination thereof.

Suitable concentrations of thermally-reactive gas used in the thermal chemical vapor deposition, by volume, are between 10% and 20%, between 10% and 15%, between 12% and 14%, between 10% and 100%, between 30% and 70%, between 50% and 80%, between 70% and 100%, between 80% and 90%, between 84% and 86%, or any suitable combination, sub-combination, range, or sub-range therein.

In one embodiment, the thermal chemical vapor deposition coating 107 is produced with the enclosed vessel being below the decomposition temperature of the fluid and is increased to above the decomposition temperature (for example, prior to, during, and/or after the introducing of the fluid). In a further embodiment, the decomposition temperature is greater than 200° C., greater than 300° C., greater than 350° C., greater than 370° C., greater than 380° C., greater than 390° C., greater than 400° C., greater than 410° C., greater than 420° C., greater than 430° C., greater than 440° C., greater than 450° C., greater than 500° C., between 300° C. and 450° C., between 350° C. and 450° C., between 380° C. and 450° C., between 300° C. and 500° C., between 400° C. and 500° C., or any suitable combination, sub-combination, range, or sub-range therein.

The fluid is cycled in a single cycle or multiple cycles, for example, with intermediate purges (for example, with inert gases, such as, nitrogen, helium, and/or argon). Suitable numbers of cycles include two cycles, three cycles, four cycles, five cycles, six cycles, seven cycles, eight cycles, nine cycles, ten cycles, eleven cycles, twelve cycles, thirteen cycles, fourteen cycles, fifteen cycles, sixteen cycles, or any suitable combination, sub-combination, range, or sub-range therein.

In one embodiment, the thermal chemical vapor deposition coating 107 is produced with the partial pressures for the fluid being between 1 Torr and 10 Torr, 1 Torr and 5 Torr, 1 Torr and 3 Torr, 2 Torr and 3 Torr, 10 Torr and 150 Torr, between 10 Torr and 30 Torr, between 20 Torr and 40 Torr, between 30 Torr and 50 Torr, between 60 Torr and 80 Torr, between 50 Torr and 100 Torr, between 50 Torr and 150 Torr, between 100 Torr and 150 Torr, less than 150 Torr, less than 100 Torr, less than 50 Torr, less than 30 Torr, or any suitable combination, sub-combination, range, or sub-range therein.

In one embodiment, the thermal chemical vapor deposition coating 107 is produced with the temperature and the pressure for being maintained for at least 10 minutes, at least 20 minutes, at least 30 minutes, at least 45 minutes, at least 1 hour, at least 2 hours, at least 3 hours, at least 4 hours, at least 5 hours, at least 7 hours, between 10 minutes and 1 hour, between 20 minutes and 45 minutes, between 4 and 10 hours, between 6 and 8 hours, or any suitable combination, sub-combination, range, or sub-range therein.

The thermal chemical vapor deposition coating 107 of the corrosion-resistant coated article 100 includes chemical constituents based upon the decomposition and/or heating of the fluid. Suitable chemical constituents include, carbon, oxygen, silicon (for example, amorphous silicon), fluorine, nitrogen, hydrogen, and combinations thereof.

In one embodiment, the thermal chemical vapor deposition coating 107 is post-cleaned, for example, in a turbulent manner and/or by repeating the treatment disclosed above. Additionally or alternatively, cleaning techniques include water deionized flushing with sonication, polyethylene pellets to soak up dust, $CO_2$ spray, and/or use of a chemical with good wetting/hydrophilicity (for example, isopropanol, ammonium hydroxide+water).

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A coated article, comprising:
   a stainless steel substrate;
   a passivation layer on the surface of the stainless steel substrate, the passivation layer being devoid of precipitates;
   a coating on the passivation layer, the coating comprising silicon.

2. The technique of claim 1, wherein the coating further includes oxygen, hydrogen, and carbon.

3. The technique of claim 2, wherein the coating further includes nitrogen.

4. The technique of claim 2, wherein the coating further includes fluorine.

5. The technique of claim 1, wherein the silicon is amorphous silicon.

6. The technique of claim 1, wherein the coating is a thermal chemical vapor deposition coating.

7. The technique of claim 1, wherein the coated article is a fitting.

8. The technique of claim 1, wherein the coated article is a tube.

9. The technique of claim 1, wherein the coated article is a valve.

10. The technique of claim 1, wherein the coated article is for liquid sampling.

11. The technique of claim 1, wherein the coated article is a filter.

12. The technique of claim 1, wherein the coated article is a liquid chromatography component.

13. The technique of claim 1, wherein the coating is positioned in the coated article.

14. The technique of claim 1, wherein the coated article is produced in a vessel while at least one additional article being coated is within the vessel.

15. The technique of claim 1, wherein the coated article is positioned in a vessel with at least one additional article.

16. The technique of claim 15, wherein the coated article and the least one additional article are positioned in a vertical orientation separated by supports.

17. The coated technique of claim 1, wherein:
    the coating further includes oxygen, hydrogen, and carbon;
    the silicon is amorphous silicon;
    the coating is a thermal chemical vapor deposition coating;
    the coated article is a liquid chromatography component; and
    the coating is positioned on the interior and the exterior of the coated article.

18. A coated liquid chromatography component, comprising:
    a metallic substrate;
    a passivation layer on the surface of the metallic substrate, the passivation layer being devoid of precipitates;

a coating on the passivation layer, the coating comprising silicon.

19. A coated article produced by a process, the process comprising:
providing a stainless steel substrate;
passivating the stainless steel substrate to produce a passivation layer, the passivation layer being devoid of precipitates;
applying a coating to the passivation layer, the coating comprising silicon.

20. The technique of claim 19, wherein the applying of the coating occurs in a vessel while additionally applying the coating to at least one additional article within the vessel.

* * * * *